(12) United States Patent
Gilliland et al.

(10) Patent No.: US 6,411,102 B1
(45) Date of Patent: Jun. 25, 2002

(54) APPARATUS FOR TESTING VARIOUS STRUCTURAL PARAMETERS OF AN ELECTRO-MAGNETIC RADIATION BARRIER

(75) Inventors: Don Alan Gilliland, Rochester; Maurice Francis Holahan, Lake City; James Larry Peacock, Rochester, all of MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/479,151

(22) Filed: Jan. 7, 2000

(51) Int. Cl.[7] .................. G01N 27/72; G01R 29/08; G01R 33/00; G01R 35/00; H05K 9/00
(52) U.S. Cl. ................. 324/627; 324/202; 324/224; 324/261; 324/262; 324/71.1; 174/35 R; 361/818
(58) Field of Search ................ 324/202, 224, 324/260–262, 71.1, 627; 361/800, 816–818; 174/35 R, 36, 35 MS

(56) References Cited

U.S. PATENT DOCUMENTS

| 3,492,568 A | * | 1/1970 | Johnson | 324/627 |
|---|---|---|---|---|
| 4,962,358 A | * | 10/1990 | Svetanoff | 324/627 |
| 5,498,968 A | * | 3/1996 | Kjebon | 324/627 |
| 5,698,818 A | * | 12/1997 | Brench | 174/35 R |
| 5,928,076 A | * | 7/1999 | Clements et al. | 174/35 R X |
| 6,211,458 B1 | * | 4/2001 | Mitchell et al. | 174/35 R |
| 6,297,446 B1 | * | 10/2001 | Cherniski et al. | 174/35 R |

* cited by examiner

Primary Examiner—Gerard R. Strecker
(74) Attorney, Agent, or Firm—Laurence R. Letson

(57) ABSTRACT

The design of an electro-magnetic radiation suppression shield and cooling housing for a computer, server or other electronic device having a computer processor may be greatly enhanced and expedited by a test apparatus that permits the placement of electro-magnetic radiation suppression plates at differing locations, spacings and alignments, which allows a variance in positioning the electro-magnetic radiation source. The test apparatus not only has an air flow cooling opening in which an electro-magnetic radiation suppression panel forms cooling air flow holes but also a fixture for disposing a second similar electromagnetic radiation suppression panel at a distance from the first electro-magnetic radiation suppression panel. Each of the panels may be substituted to test various designs. The test apparatus further is provided with a telescoping support projecting into the interior cavity so that the electromagnetic radiation source may be moved about in the interior and thus simulate a large number of positions and conditions. The test apparatus provides a greatly enhanced tool in the trial and error approach to electro-magnetic radiation control.

20 Claims, 3 Drawing Sheets

APPARATUS FOR TESTING VARIOUS STRUCTURAL PARAMETERS OF AN ELECTRO-MAGNETIC RADIATION BARRIER

FIELD OF THE INVENTION

This invention relates to the design of suppression devices for controlling the electro-magnetic radiation which is radiated from electronic devices such as computer processors and, more specifically, to the testing of design parameters of such devices by providing readily changeable structural parameters of such an electro-magnetic radiation suppression device.

BACKGROUND OF THE INVENTION

United States government standards require control of electro-magnetic interference for all devices such as computers, servers, and other electronic devices which may emit electro-magnetic radiation from their electronic components. Electro-magnetic interference is defined as the adverse affects of electro-magnetic radiation emitted in proximity to an electro-magnetic radiation sensitive device.

Electro-magnetic interference can be caused by electro-magnetic radiation which has escaped from a device within which it is generated. Electro-magnetic interference can cause interference with the proper operation of television sets, radios and other electronic devices; moreover, it can interfere with computers and servers wherein the foreign electro-magnetic interference affects the reliability and/or performance of computer processors in such systems.

Whenever electro-magnetic radiation suppression enclosures are sealed in an effort to contain or suppress the escape of electro-magnetic radiation from the region in which it is generated, these efforts are usually quite effective. The enclosures need only to totally enclose the electro-magnetic radiation generating source and to be electrically grounded. However, it is seldom practical to perfectly enclose the electro-magnetic radiation source inasmuch as the electro-magnetic radiation sources are commonly mounted on circuit boards which may not be practically enclosed totally. Additionally, the electro-magnetic radiation source may generate sufficient heat during its operation that the heat must be dissipated in order to prevent the electronic devices from overheating and resulting in circuit or component failure.

The least expensive cooling technique is the passage of cooling air through the electro-magnetic radiation suppression shield. This approach requires air flow openings in the electro-magnetic radiation suppression shield. The cooling air flow openings in the electro-magnetic radiation suppression enclosures or shields also provide escape routes for the electro-magnetic radiation. As it becomes impossible to totally eliminate the escape of electro-magnetic radiation and to simultaneously air cool the computer processors or other sources of electro-magnetic radiation, an acceptable compromise may be obtained with the reduction of the size of the holes in the air flow path, which reduces the escape of electro-magnetic radiation and the wavelengths of any escaping electro-magnetic radiation. If the holes are formed into or by an electrically conductive material such as sheet metal or electrically conductive screening, the large plurality of holes of relatively small dimensions will reduce very significantly the electro-magnetic radiation passing through the air flow aperture in the electro-magnetic radiation shield or suppression enclosure.

The electrically conductive electro-magnetic radiation suppression plate placed in an air cooling opening in the electro-magnetic radiation suppression shield greatly reduces the escaping electro-magnetic radiation and reduces its effect on the remaining escaping electro-magnetic radiation which then becomes a lower level electro-magnetic interference.

To a great extent, the control of electro-magnetic radiation and the reduction of the electro-magnetic interference with other electronic equipment is accomplished by "trial and error" design. The enclosures are fabricated and tested and, from these results, variations of the enclosure are fabricated and tested. This process can be and is repeated many times at a substantial expense before determination of an acceptable level of electro-magnetic interference and the specific design of the electro-magnetic radiation suppression enclosure.

The design and verification process to suppress and control electro-magnetic radiation can be laborious and time consuming as well as expensive. Continuing goals of electro-magnetic radiation control and suppression designers are to shorten, improve, and reduce the cost of electro-magnetic radiation suppression enclosure design as well as to improve the air flow characteristics of cooling designs thus incorporated into the electro-magnetic radiation suppression devices.

OBJECTS OF THE INVENTION

It is an object of the invention to improve the design of electro-magnetic radiation suppression shields, thereby improving control of electro-magnetic interference.

It is another object of the invention to assist in the design of improved electro-magnetic radiation suppression enclosures for use in devices having electro-magnetic radiation generating electronic components.

It is a further object of the invention to eliminate the need to fabricate a large plurality of test specimens of electro-magnetic radiation suppression enclosures, each incorporating some of the variations of test parameters for testing the electro-magnetic radiation escape from the enclosures.

It is an additional object of the invention to provide a degree of variability in a plurality of parameters that may effect the level of electro-magnetic interference outside the electro-magnetic radiation suppression enclosure being designed.

It is still an additional object of the invention to provide for a variation of the type of electro-magnetic radiation suppression plate being tested while providing both ease in changeability and adequate cooling air flow.

It is a still further object of the invention to provide for variable placement of test electro-magnetic radiation suppression plates relative to the cooling air flow openings in each electro-magnetic radiation suppression enclosure being tested.

Other objects of the invention will become apparent to one of ordinary skill in the art.

SUMMARY OF THE INVENTION

The shortcomings of the prior art are overcome and the objects of the invention accomplished by the present invention summarized below.

A hollow metal container or enclosure, an electro-magnetic radiation suppression shield, is provided with a back or rear wall which is removable and which has an electro-magnetic radiation source support mounted thereon. The electro-magnetic radiation source support is capable of extension and retraction to permit variable positioning of the electro-magnetic radiation source within the metal container for ease in the electro-magnetic radiation testing. The electro-magnetic radiation suppression shield is provided with an end plate which also is easily removable. A removable end plate supports electro-magnetic radiation suppression plates and further is provided with electro-magnetic radiation suppression plate mounting hardware to dispose at various separations the electro-magnetic radiation suppression plates. The hardware also permits easy changing of the separations between the electro-magnetic radiation suppression plates. The electro-magnetic radiation suppression plates may be interchanged to allow testing of various air flow hole sizes, shapes, and patterns. Similarly, if desired, the size and pattern of the air passages or openings in the end wall or end plate may be varied to provide variations in air flow capacity.

The provision to enable easy changes in the configuration of test apparatus allows testing of a large number of design configurations of electro-magnetic radiation suppression plates, the spacing of the electro-magnetic radiation suppression plates, and positioning of the electro-magnetic radiation suppression plates relative to an electro-magnetic radiation source.

The use of this invention results in an effective improvement in electro-magnetic radiation suppression for products because the invention simplifies testing a large number of parameters and thus the selection of design parameters which result in the lowest electro-magnetic radiation escaping from the electro-magnetic radiation shield design in the final product.

A more complete understanding of the invention may be had from the attached drawings and the detailed description of the preferred embodiment of the best mode of the invention which follows.

A DETAILED DESCRIPTION OF THE PREFERRED

EMBODIMENT OF THE BEST MODE OF THE INVENTION

AS CONTEMPLATED BY THE INVENTORS

Figure 1:
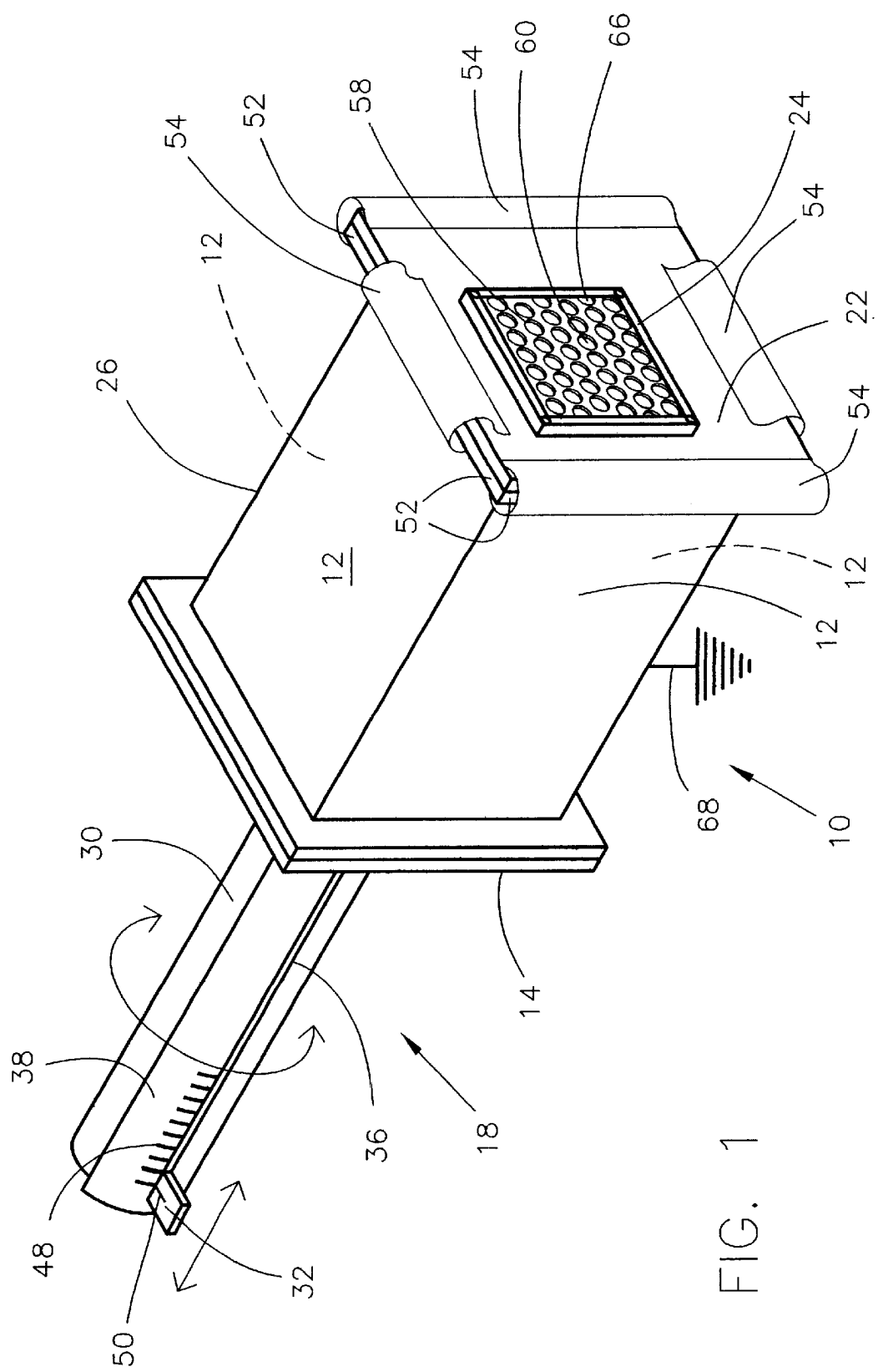
FIG. 1 illustrates the exterior of the electro-magnetic radiation suppression test apparatus in a left elevated perspective view.
Figure 2:
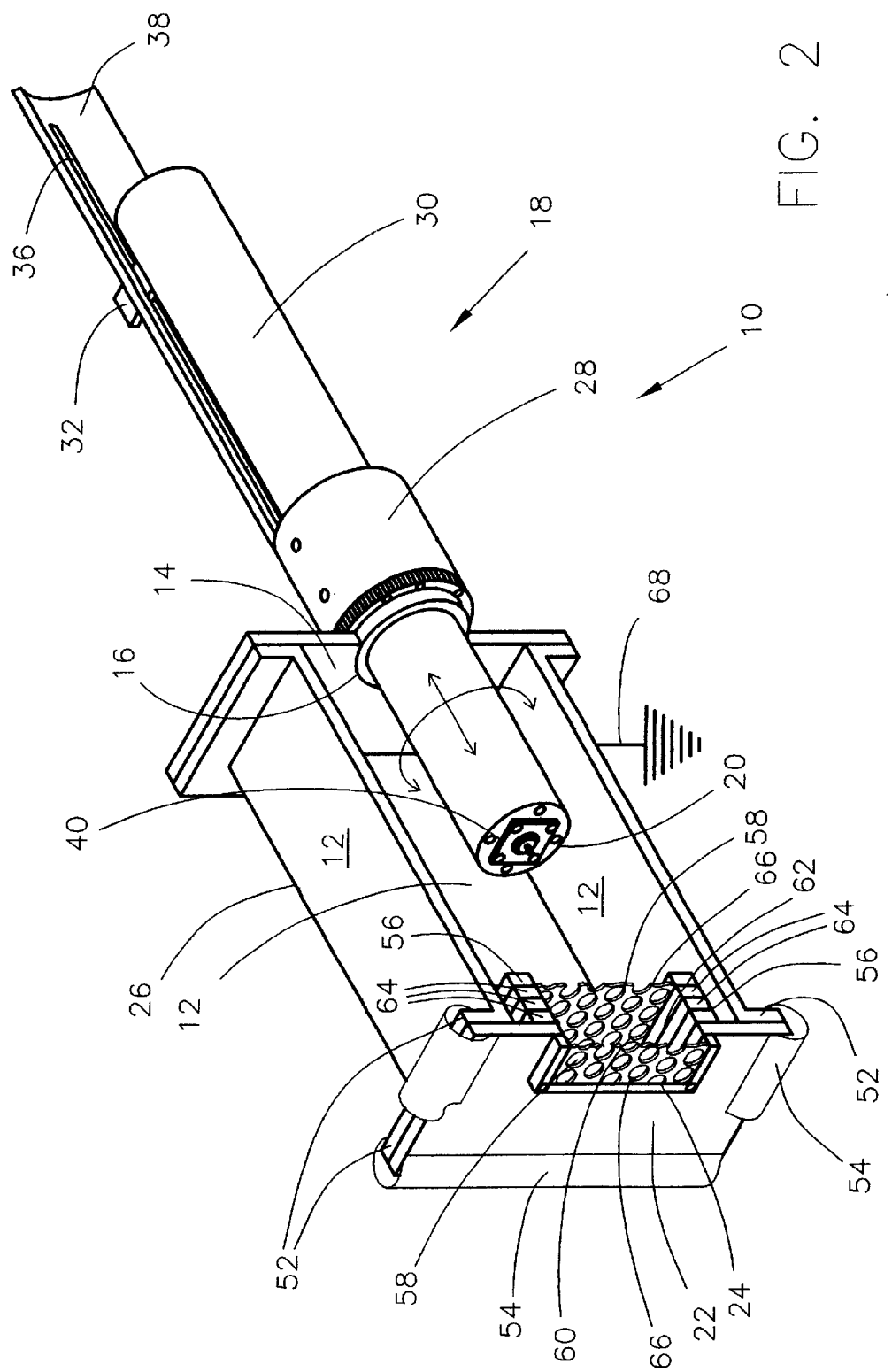
FIG. 2 is a right elevated perspective sectional view of the electro-magnetic radiation suppression test apparatus.

The assembled electro-magnetic radiation suppression test apparatus 10 is variously illustrated in FIGS. 1 and 2. The body of the electro-magnetic radiation suppression test apparatus 10 is typically and preferably a metal box having sides 12 forming a rectangular structure 26. The rear of the hollow rectangular structure 26 is preferably closed by a rear wall 14 having an aperture 16 through which an emitter support 18 extends.

Closing the front end of rectangular structure 26 is a plate 22 which has an opening 24 formed therein. Opening 24 is formed in the shape and of the dimensions of a specific air flow opening being considered for use in an electronic apparatus (such as a computer, server or other electronic device) which has a processor or other source of electro-magnetic radiation, emitter 20. End panel 22 or plate 22 may be and preferably is mounted temporarily on the rectangular structure 26 for ease in testing. Additionally, if varied opening configurations and sizes are to be tested, it is more convenient to have plate 22 temporarily mounted to accomplish an easy removal and substitution or changing of the electro-magnetic radiation suppression plates 60.

The rear plate or rear wall 14 supports the emitter support 18. Emitter support 18 is preferably a telescoping structure. Emitter support 18 has a collar 28 which may be rigidly attached to the rear wall 14 at aperture 16 and includes an extendible or telescoping tubular member 30 projecting through collar 28, presenting one end 40 of tubular member 30 within the enclosure formed by walls 12, rear wall 14 and end plate or front wall 22. Tubular member 30 is movable by a tab 32. Tab 32 projects from tubular member 30 through a slot 36 formed into a guide 38. As tab 32 is moved along slot 36, tubular member 30 is moved along with tab 32. This capability of reciprocal movement allows end 40 of tubular member 30 to be positioned at various test positions within rectangular structure 26.

Figure 3:
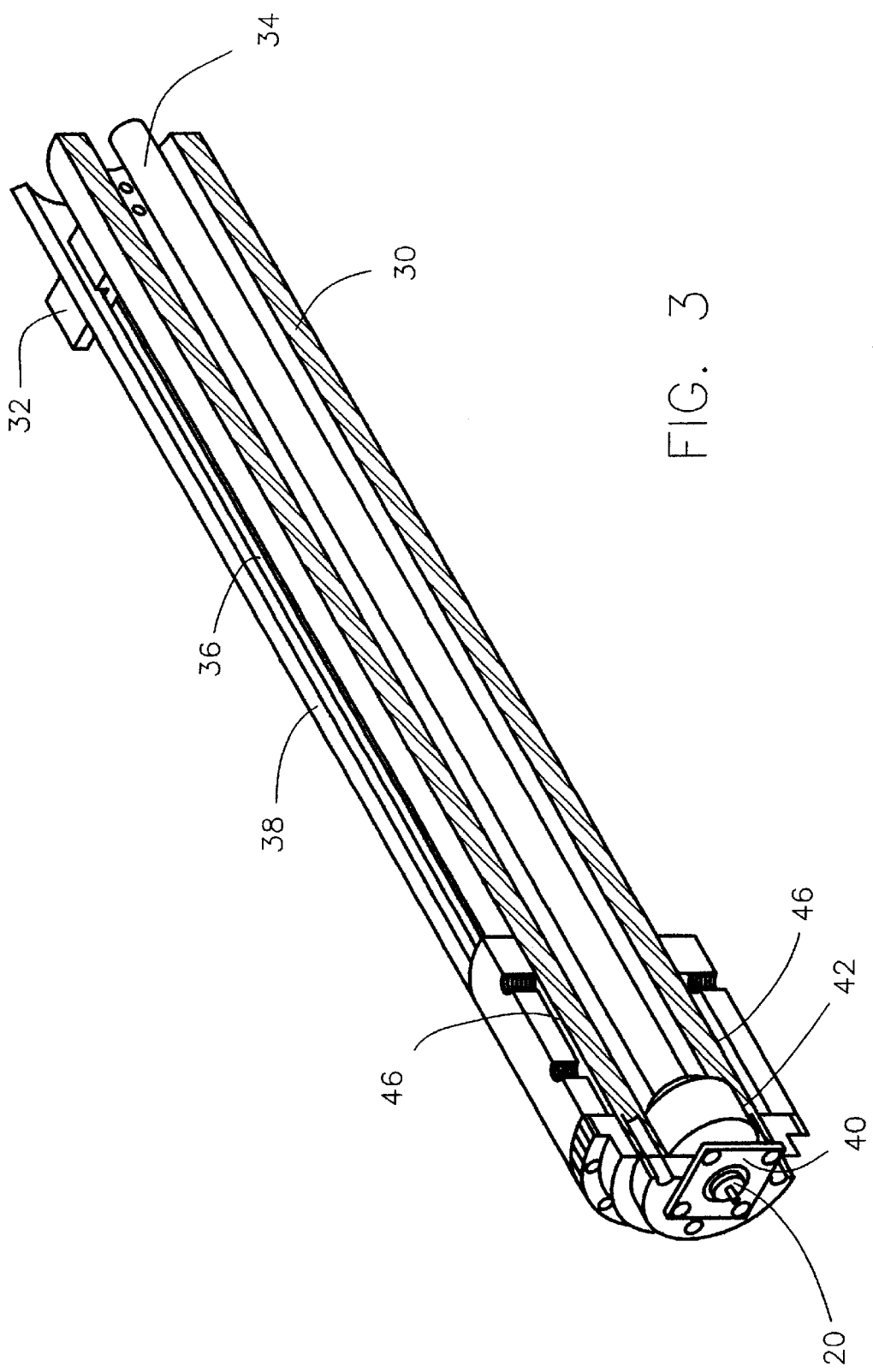
FIG. 3 is a sectional view of the electro-magnetic radiation emitter support.

Referring to the FIG. 3, note that collar 28, tubular member 30, guide 38 and tab 32 are illustrated with collar 28 and tubular member 30 partially cut away.

Routed within tubular member 30, connected to connector 42, is an electrical cable 34, to provide signals to the emitter 20. Connector 42 permits connection and disconnection of the emitter 20, facilitating the changing of the emitter 20 to a different type emitter more closely approximating the actual electro-magnetic radiation emitter to be used in the final product. The changeability of the emitter 20 allows the emissions from emitter to be changed to more closely mimic the actual emissions anticipated in the production levels of the computer, server or other device in which the actual electro-magnetic radiation emitter and the resulting electro-magnetic radiation suppression design are to be used.

Emitter 20 is supplied those electrical signals necessary to produce electro-magnetic radiation for test purposes over cable 34.

Tubular member 30 is further rotatable about its longitudinal axis to vary the rotational orientation of the emitter 20 because most electro-magnetic radiation emitters do not necessarily radiate in a uniform pattern. Thus, rotational placement of the electro-magnetic radiation source 20 relative to the opening 24 in end plate 22 may affect the amount of electro-magnetic radiation passing through opening 24.

Foam electro-magnetic control gaskets 46, which trap any electro-magnetic radiation attempting to escape between collar 28 and tubular member 30, seal tubular member 30 and collar 28 to electro-magnetic radiation leakage.

Guide 38 may be provided with a scale 48 of arbitrary graduations, and tab 32 may have a mark 50 to aid in repeatedly positioning electro-magnetic radiation source or emitter 20 within rectangular structure 26. Similarly, collar 28 and tubular member 30 also may carry indicia (not shown) for repeatedly positioning rotationally the emitter 20.

Referring again to the FIGS. 1 and 2 and particularly to end plate 22, the rectangular structure 26 is closed by installation of end plate 22 over the opening formed by walls 12. Walls 12 are illustrated as further having portions bent outwardly forming flanges 52. Flanges 52 provide a surface and structure against which end plate 22 may be positioned and to which end plate 22 may be attached. Attachment may be made with spring clips 54, such as formed clips 54, which slip over flange 52 and end plate 22. Alternatively, other clips such as binder clips which can be used to hold several sheets of paper, replacing formed clips 54. Binder clips not only have a high holding force and finger-engageable lever handles but are readily and inexpensively available in office supply stores.

As is easily observable in FIG. 2, on the interior surface of end plate 22 and surrounding opening 24 are disposed support members 56 which envelope the edges of electro-magnetic radiation suppression plates 60. The support members 56 form a passageway 62 through which a cooling air flow may pass. The support members 56 may be a series of rigid members with channels (not shown) formed into them and into which electro-magnetic radiation suppression test plates 60 may be inserted. Alternatively, the support members 56 may be made of a stack of spacers or shims which may be assembled to clamp the electro-magnetic radiation suppression test plates 60 at known interplate distances. FIG. 2 illustrates a plurality of spacers 64 which are ganged to hold and space electro-magnetic radiation suppression test plates 60 at a known distance from each other. The distance between plates 60 may be varied by changing the thickness of the spacers 64. The spacing affects the amount of suppression of the electro-magnetic radiation escaping the test apparatus 10.

Electro-magnetic radiation suppression plates 60 may be of any type or design that the designer wishes to be tested. The purpose of the electro-magnetic radiation suppression plates 60 is to reduce to insignificant levels the electro-magnetic radiation which escapes from test structure 10 through an air cooling passage or opening 24 in end plate 22 although permitting the passage of sufficient air flow necessary to cool the electrical components enclosed by the test structure 10.

The electro-magnetic radiation suppression plates 60 may be of various structural forms; one form could be flat metal plates 58 with a plurality of holes 66 punched or pierced into the sheets 58. The holes 66 may be round, rectangular, oval or any other desired shape. Alternatively, the electro-magnetic radiation suppression plate 60 may be of expanded metal formed in that a metal plate 58 is cut or pierced to form a plurality of cuts, generally parallel but staggered with respect to each other. Then, the edges of the metal plate 58 are pulled in a direction perpendicular to the cuts in the plane of the material. This pulling or stretching opens generally diamond-shaped holes 66 in the sheet metal plates 58. The holes 66 in one electro-magnetic radiation suppression plate 60 may be overlapped or aligned with holes 66 in an adjacent electro-magnetic radiation suppression plate 60 or the holes 66 may be misaligned or staggered relative to holes 66 in an adjacent electro-magnetic radiation suppression plate 60. The alignment or misalignment may advantageously affect the electro-magnetic radiation escaping through the cooling air flow opening 24.

The alignment or misalignment of the openings 66, the shape of the openings 66, the size of the openings 66, and the spacing between suppression plates 60 may all vary according to the air flow capacity and cooling required. as well as the amount of electro-magnetic radiation escaping from the test apparatus 10 through opening 24 in the various test conditions and combinations.

The position of the electro-magnetic radiation suppression plates 60 may be varied to create different spacing between the electro-magnetic radiation suppression plates 60. Different patterns of openings 66 in electro-magnetic radiation suppression plates 60 may be used in the testing as well as other variations in opening size and shape.

In order to absorb and dispose of the electro-magnetic radiation energy absorbed by the electro-magnetic radiation suppression plates 60, the electro-magnetic radiation suppression plates 60 must be connected to electrical ground 68, either through contact with the rectangular structure 26 or directly through a conductor or ground wire. The rectangular structure is similarly connected to electrical ground 68 to simulate the electrical grounding of a comparable electro-magnetic radiation suppression shield which is being considered for installation in a computer, server or other electronic device under design consideration. The grounding of the rectangular structure 26 and the resulting structure in the final product (not shown) is similarly required in order to absorb and dispose of any electro-magnetic radiation energy absorbed by the electro-magnetic radiation suppression structure 26.

Using the laboratory test apparatus 10, testing is accomplished by positioning the test apparatus 10 within an environment where there is substantially no electro-magnetic interference from other unrelated sources and then powering emitter 20 to create the electro-magnetic radiation. The electro-magnetic radiation which escapes the test apparatus 10 is measured at various locations and positions in accordance with well established test criteria. A person of ordinary skill in electro-magnetic radiation testing and measurement will know of and understand the testing procedures and the testing procedures and conditions need not be further explained.

After the measurements have been taken for a particular position of the emitter 20 and the electro-magnetic radiation suppression plates 60, the position of the emitter 20 may be altered and the measurements of the electro-magnetic interference repeated. The positions of the emitter and suppression plates may be further altered and the emissions re-measured. The procedure may be repeated as necessary to establish each of the various positions of the components of the test apparatus 10 correlated to the electro-magnetic interference readings needed to determine the best electro-magnetic radiation control design.

If alternate design electro-magnetic radiation suppression plates 60 are to be considered for the design of the electronic product, the testing procedure may be repeated with the alternative electro-magnetic radiation suppression plates 60 with the resulting electro-magnetic interference measured as discussed above. Comparison of the results will provide the tester with information which will help determine what form the electro-magnetic radiation suppression plates 60 should take and the relative positions of the suppression plates 60 both relative to each other and to the emitter source 20 itself for optimum electro-magnetic radiation suppression for that particular emitter source 20.

After testing is complete for as many variable parameters as are desired, i.e., suppression plate 60 spacing, suppression plate 60 apertures size, shape and alignment/misalignment, emitter's 20 position and rotational disposition, then rectangular structure 26 is removed from the rear wall 14 and placed on an air flow test bench. Air flow is passed through the rectangular structure 26 and measured to determine the pressure drop and fan requirements necessary for moving the required air volume both through opening 24 and through the electro-magnetic radiation suppression plates 60. In the final design of the using product, electro-magnetic radiation suppression plates 60 may be selected and positioned to the parameters which permit the smallest amount of electro-magnetic radiation to escape from the test apparatus 10 while at the same time insure adequate cooling air flow.

Rectangular structure 26 is designed and dimensioned to be the same as that which is to be assembled into the using device with the exception that the end plate 22 and the structure for supporting electro-magnetic radiation suppression plates 60 may be made fixed and permanently mounted. For example, end plate 22 and walls 12 may be welded or otherwise sealed to further contain and conduct electro-magnetic radiation within structure 26; the suppression plates may be mounted by use of screws or rivets or any of other types of retainers.

The advantages of the invention include the improved variability of the various parameters affecting the electro-magnetic radiation escape from the electro-magnetic radiation shield and the ease with which the various parameters may be changed during testing, thereby eliminating the need to construct a multitude of electro-magnetic radiation suppression shields with varying electro-magnetic radiation suppression plates, each having a large number of cooling air flow opening configurations and arrangements.

The electro-magnetic interference which escapes from the test equipment is measured in a conventional manner in conformance with established test procedures that are well known to those of ordinary skill in the art of the electro-magnetic radiation suppression and electro-magnetic interference testing and does not need to be further described herein.

Variations, changes and modifications to the invention may be made by one of skill in the art without removing the resulting structure from the scope of the attached claims which define the scope of the invention.

We claim:

1. A test apparatus for aiding in designing and testing enclosures for suppression of electro-magnetic radiation comprising:
    an electrically grounded conductive enclosure defined by walls and at least one end panel;
    said end panel forming a cooling air flow opening therethrough;
    said air flow opening covered by a first electro-magnetic radiation suppressing, air flow passing member;
    a second electro-magnetic radiation suppressing, air flow passing member;
    a fixture for supporting said second electro-magnetic radiation suppressing, air flow passing member spaced from said first electro-magnetic radiation suppressing air flow passing member and juxtaposed with said first electro-magnetic radiation suppressing air flow passing member,
    said second electro-magnetic radiation suppressing member disposable in said fixture at variable distances from said first electro-magnetic radiation suppressing member, and
    an electro-magnetic radiation source disposed within said enclosure for providing electro-magnetic radiation within said enclosure,
        whereby any of said electro-magnetic radiation escaping from said enclosure may be measured for a plurality of electro-magnetic radiation suppressing configurations of said test apparatus.

2. The test apparatus for aiding in designing and testing enclosures for suppression of electro-magnetic radiation of claim 1 wherein said electro-magnetic radiation source is mounted for movement within said container, whereby disposition of said electro-magnetic radiation source within said container may be varied to vary conditions of electro-magnetic radiation for measurement of any of said electro-magnetic radiation escaping from said enclosure.

3. The test apparatus for aiding in designing and testing enclosures for suppression of electro-magnetic radiation of claim 2 wherein said movement is toward or away from said cooling air flow opening.

4. The test apparatus for aiding in designing and testing enclosures for suppression of electro-magnetic radiation of claim 2 wherein said electro-magnetic radiation source is disposed within said container for rotational movement relative to said enclosure.

5. The test apparatus for aiding in designing and testing enclosures for suppression of electro-magnetic radiation of claim 2 wherein said electro-magnetic radiation suppression members are removably supported relative to said walls of said enclosure.

6. The test apparatus for aiding in designing and testing enclosures for suppression of electro-magnetic radiation of claim 5 wherein said electro-magnetic radiation suppressing members are electrically grounded.

7. The test apparatus for aiding in designing and testing enclosures for suppression of electro-magnetic radiation of claim 6 wherein said first and said second electro-magnetic radiation suppressing members comprise metallic mesh members.

8. The test apparatus for aiding in designing and testing enclosures for suppression of electro-magnetic radiation of claim 7 wherein said mesh members comprise metal sheets forming a plurality of air flow passages therethrough.

9. The test apparatus for aiding in designing and testing enclosures for suppression of electro-magnetic radiation of claim 7 wherein said mesh members comprise pierced and expanded metal sheets.

10. The test apparatus for aiding in designing and testing enclosures for suppression of electro-magnetic radiation of claim 7 wherein said mesh members comprise non-conductive mesh members coated with a conductive metal layer.

11. An electro-magnetic radiation suppression test apparatus comprising:
    an electrically grounded conductive enclosure comprising a plurality of walls;
    an electro-magnetic radiation source displaceably disposed within said enclosure;
    an air flow opening in at least one of said walls;
    a plurality of variably separated electro-magnetic radiation suppressing air flow permitting members disposed co-extensive with said air flow opening, and
    said plurality of electro-magnetic radiation suppressing members disposable at a separating distance therebetween,
        thereby permitting electro-magnetic radiation emission measurements for differing conditions of separation of said electro-magnetic radiation suppressing air flow permitting members.

12. The electro-magnetic radiation suppression test apparatus of claim 11 wherein said electro-magnetic radiation source is variably positionally disposed within said enclosure.

13. The electro-magnetic radiation suppression test apparatus of claim 12 wherein said plurality of electro-magnetic radiation suppressing, air flow permitting members comprise metallic mesh.

14. The electro-magnetic radiation suppression test apparatus of claim 13 wherein said mesh members comprise pierced metal sheets, forming a plurality of air flow passages therethrough.

15. The electro-magnetic radiation suppression test apparatus of claim 13 wherein said mesh members comprise expanded metal sheets.

16. The electro-magnetic radiation suppression test apparatus of claim 12 wherein said plurality of electro-magnetic radiation suppressing, air flow permitting members comprise a non-conductive mesh with a conductive coating.

17. An electro-magnetic radiation control test device for testing the positioning of electro-magnetic radiation suppression members in a cooling air flow path comprising:
   a means for enclosing an electro-magnetic radiation source;
   said means for enclosing defining a means for air flow entry thereinto;
   support means for disposing means for suppressing Electromagnetic radiation passing through said means for air flow entry and escaping from said means for enclosing;
   said support means for disposing positioning at least a pair of said means for suppressing electro-magnetic radiation at one of a plurality of selectable distances therebetween within said cooling air flow path, and
   means for maintaining electrical continuity between said means for enclosing and said means for suppressing electro-magnetic radiation,
   whereby determination may be empirically made relating to spacing of said means for suppressing electro-magnetic radiation to achieve maximum suppression of electro-magnetic radiation passing through said means for air flow entry.

18. The electro-magnetic radiation control test device for testing the positioning of electro-magnetic radiation suppression members of claim 17 wherein said means for suppressing electro-magnetic radiation comprises a plurality of air passages.

19. The electro-magnetic radiation control test device for testing the positioning of electro-magnetic radiation suppression members of claim 18 wherein said means for suppressing electro-magnetic radiation is comprised of at least a pair of sheets of electrically conductive perforated material, said sheets separated by a distance, said distance variable for providing multiple test conditions.

20. The electro-magnetic radiation control test device for testing the positioning of electro-magnetic radiation suppression members of claim 19 wherein said electro-magnetic radiation source is movable within said means for enclosing for providing multiple test configurations.

* * * * *